(12) United States Patent
Somisetty et al.

(10) Patent No.: US 11,057,990 B2
(45) Date of Patent: Jul. 6, 2021

(54) FLEXIBLE SUBSTRATE AND A METHOD THEREOF

(71) Applicant: WELLNESYS INC., Suwanee, GA (US)

(72) Inventors: Muralidhar Somisetty, Bangalore (IN); Pranav Kanuparthi, Bangalore (IN); Sankar Dasiga, Bangalore (IN)

(73) Assignee: WELLNESYS INC., Suwanee, GA (US)

( * ) Notice: Subject to any disclaimer, the term of this patent is extended or adjusted under 35 U.S.C. 154(b) by 0 days.

(21) Appl. No.: 16/609,222

(22) PCT Filed: Nov. 2, 2018

(86) PCT No.: PCT/IB2018/058612
§ 371 (c)(1),
(2) Date: Oct. 29, 2019

(87) PCT Pub. No.: WO2019/162742
PCT Pub. Date: Aug. 29, 2019

(65) Prior Publication Data
US 2021/0068245 A1    Mar. 4, 2021

(30) Foreign Application Priority Data

Feb. 22, 2018    (IN) .............................. 201841006773

(51) Int. Cl.
*H05K 1/02* (2006.01)
*H05K 1/03* (2006.01)
*H05K 1/18* (2006.01)

(52) U.S. Cl.
CPC ............. *H05K 1/028* (2013.01); *H05K 1/032* (2013.01); *H05K 1/0393* (2013.01); *H05K 1/189* (2013.01);
(Continued)

(58) Field of Classification Search
CPC ................. H05K 1/028; H05K 1/0393; H05K 1/186–189
See application file for complete search history.

(56) References Cited

U.S. PATENT DOCUMENTS

| 8,380,327 B2* | 2/2013 | Park ....................... G05B 11/01 |
| | | 700/1 |
| 2013/0083496 A1* | 4/2013 | Franklin ............... G06F 3/0416 |
| | | 361/749 |

(Continued)

FOREIGN PATENT DOCUMENTS

WO    WO2018009150 A1    1/2018

OTHER PUBLICATIONS

International Search Report and Written Opinion dated Jan. 29, 2019 from International Application No. PCT/IB2018/058612, 09 pages.

*Primary Examiner* — Hoa C Nguyen
(74) *Attorney, Agent, or Firm* — IPhorizons PLLC; Narendra Reddy Thappeta

(57) ABSTRACT

A flexible substrate and a method thereof are provided. The flexible substrate includes a first flexible layer fabricated with at least one conducting path, and configured to sustain an electric power within the conducting path, a second flexible layer fabricated with one or more sensors connected in a form of a matrix, and the second flexible layer configured to generate a signal upon receiving an interaction from at least one user, a third flexible layer fabricated in-between the first flexible layer and the second flexible layer, and configured to insulate the conducting path of the first flexible layer from a matrix connection of the second flexible layer, at least one support structure operatively coupled to the first flexible layer, the second flexible layer and the third flexible
(Continued)

layer, and configured to receive the signal generated by the second flexible layer and to provide a support.

19 Claims, 7 Drawing Sheets

(52) U.S. Cl.
CPC ............... *H05K 2201/0116* (2013.01); *H05K 2201/0158* (2013.01); *H05K 2201/10037* (2013.01); *H05K 2201/10098* (2013.01); *H05K 2201/10151* (2013.01)

(56) References Cited

U.S. PATENT DOCUMENTS

| | | | | |
|---|---|---|---|---|
| 2014/0062892 | A1* | 3/2014 | Dickinson | G06F 1/1652 345/173 |
| 2015/0378391 | A1* | 12/2015 | Huitema | G09F 9/301 361/679.03 |
| 2016/0037625 | A1* | 2/2016 | Huitema | H05K 1/0281 361/749 |
| 2017/0295642 | A1 | 10/2017 | Codd et al. | |

* cited by examiner

FLEXIBLE SUBSTRATE AND A METHOD THEREOF

This International Application claims priority from a complete patent application filed in India having Patent Application No. 201841006773, filed on Feb. 22, 2018 and titled "A FLEXIBLE SUBSTRATE AND A METHOD THEREOF".

BACKGROUND

Embodiments of the present disclosure relate to flexible substrate, and more particularly to a flexible substrate and a method thereof.

Flexible substrate is a type of substrate on which electronic circuit assemblies are mounted giving rise to a technology of flexible electronics which is also known as flex circuits. One form of flexible electronic assemblies is manufactured using identical components which are used on a rigid printed circuit boards, allowing the printed circuit boards to flex while in use. Another form of flexible electronics involves various etching techniques to scale down a traditional substrate material to gain flexibility. Further, the flexible substrate may be mounted or fabricated with one or more sensors such as a contact sensor or a proximity sensor which may be used in various applications such as a door to monitor an operation or a mat to detect the range of contact of a user with the mat.

In one approach, the flexible substrate which is used on a object is made up of a flexible plastic substrate such as a polyimide, polyether ether ketone (PEEK) or conductive polyester to make the substrate layer flexible. Further, the object consists of pressure sensors integrated within the object, and configured to detect the pressure exerted by the user on the object. However in such system the amount of pressure applied by the user on the object cannot determine whether the applied pressure is in right contact with the object or not. Further, since the flexible substrate is made up of a single layer, the chances of having short circuit between components in the system is high, which in turn reduces the efficiency of the system. Further, the leakage current in the system increases due to a lack of insulation between the components is high.

Hence, there is a need for an improved flexible substrate a method to operate the same.

BRIEF DESCRIPTION

In accordance with one embodiment of the disclosure, a flexible substrate is provided. The flexible substrate includes a first flexible layer fabricated with at least one conducting path. The first flexible layer is configured to sustain an electric power within the conducting path. The flexible structure also includes a second flexible layer fabricated with one or more sensors connected in a form of a matrix. The second flexible layer is configured to generate a signal upon receiving an interaction from at least one user. The flexible structure further includes a third flexible layer fabricated in-between the first flexible layer and the second flexible layer. The third flexible layer is configured to insulate the conducting path of the first flexible layer from a matrix connection of the second flexible layer. The flexible substrate further includes at least one support structure operatively coupled to the first flexible layer, the second flexible layer and the third flexible layer. The at least one support structure is configured to receive the signal generated by the second flexible layer. The at least one support structure is also configured to provide a support for the first flexible layer, the second flexible layer and the third flexible layer.

In accordance with another embodiment of the disclosure, a method for the flexible structure is provided. The method includes fabricating a first flexible layer. The method also includes fabricating a conducting path on the first flexible layer. The method further includes mounting a plurality of sensors in a form of a matrix on a second flexible layer. The method further includes fabricating a third flexible layer. The method further includes mounting a third flexible layer in-between the first flexible layer and the second flexible layer. The method further includes mounting the second flexible layer on top of the third flexible layer. The method further includes fabricating at least one support structure.

To further clarify the advantages and features of the present disclosure, a more particular description of the disclosure will follow by reference to specific embodiments thereof, which are illustrated in the appended figures. It is to be appreciated that these figures depict only typical embodiments of the disclosure and are therefore not to be considered limiting in scope. The disclosure will be described and explained with additional specificity and detail with the appended figures.

BRIEF DESCRIPTION OF THE DRAWINGS

The disclosure will be described and explained with additional specificity and detail with the accompanying figures in which.

Figure 1:
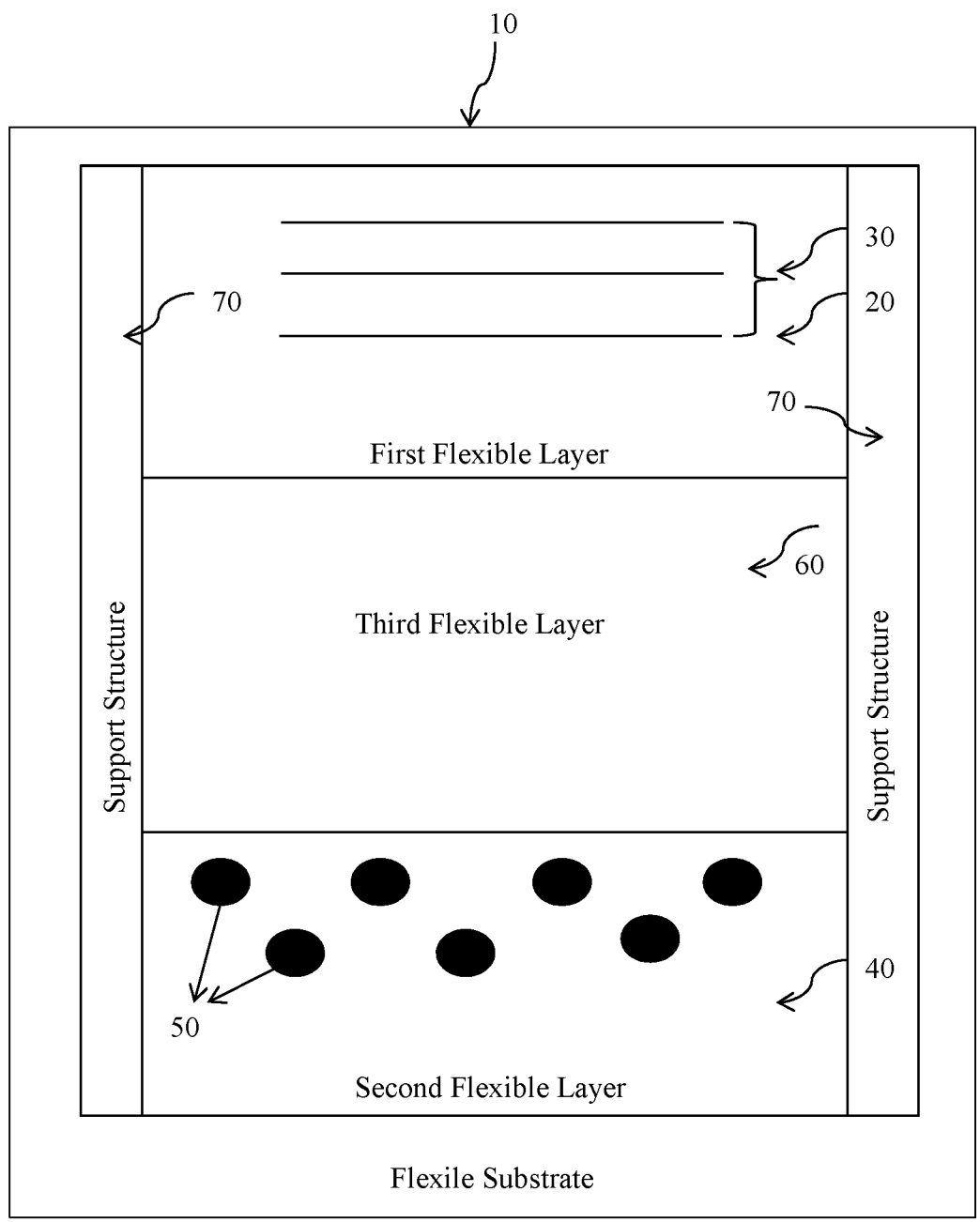
FIG. 1 is a block diagram of a flexible substrate in accordance with an embodiment of the present disclosure.

Further, those skilled in the art will appreciate that elements in the figures are illustrated for simplicity and may not have necessarily been drawn to scale. Furthermore, in terms of the construction of the device, one or more components of the device may have been represented in the figures by conventional symbols, and the figures may show only those specific details that are pertinent to understanding the embodiments of the present disclosure so as not to obscure the figures with details that will be readily apparent to those skilled in the art having the benefit of the description herein.

DETAILED DESCRIPTION

For the purpose of promoting an understanding of the principles of the disclosure, reference will now be made to the embodiment illustrated in the figures and specific language will be used to describe them. It will nevertheless be understood that no limitation of the scope of the disclosure is thereby intended. Such alterations and further modifications in the illustrated system, and such further applications of the principles of the disclosure as would normally occur to those skilled in the art are to be construed as being within the scope of the present disclosure.

The terms "comprises", "comprising", or any other variations thereof, are intended to cover a non-exclusive inclusion, such that a process or method that comprises a list of steps does not include only those steps but may include other steps not expressly listed or inherent to such a process or method. Similarly, one or more devices or sub-systems or elements or structures or components preceded by "comprises . . . a" does not, without more constraints, preclude the existence of other devices, sub-systems, elements, structures, components, additional devices, additional sub-systems, additional elements, additional structures or additional components. Appearances of the phrase "in an embodiment", "in another embodiment" and similar language throughout this specification may, but not necessarily do, all refer to the same embodiment.

Unless otherwise defined, all technical and scientific terms used herein have the same meaning as commonly understood by those skilled in the art to which this disclosure belongs. The system, methods, and examples provided herein are only illustrative and not intended to be limiting.

In the following specification and the claims, reference will be made to a number of terms, which shall be defined to have the following meanings. The singular forms "a", "an", and "the" include plural references unless the context clearly dictates otherwise.

Embodiments of the present disclosure relate to a flexible substrate. The flexible substrate includes a first flexible layer fabricated with at least one conducting path. The first flexible layer is configured to sustain an electric power within the conducting path. The flexible structure also includes a second flexible layer fabricated with one or more sensors connected in a form of a matrix. The second flexible layer is configured to generate a signal upon receiving an interaction from at least one user. The flexible structure further includes a third flexible layer fabricated in-between the first flexible layer and the second flexible layer. The third flexible layer is configured to insulate the conducting path of the first flexible layer from a matrix connection of the second flexible layer. The flexible substrate further includes at least one support structure operatively coupled to the first flexible layer, the second flexible layer and the third flexible layer. The at least one support structure is configured to receive the signal generated by the second flexible layer. The at least one support structure is also configured to provide a support for the first flexible layer, the second flexible layer and the third flexible layer.

FIG. 1 is a block diagram of a flexible substrate in accordance with an embodiment of the present disclosure. The flexible substrate (10) includes a first flexible layer (20) fabricated with at least one conducting path (30), and configured to sustain an electric power within the conducting path (30). As user herein, a substrate is a thin slice of material which forms a foundation upon which one or more electronic devices are deposited. Further, the substrate is usually made up of silicon, silicon dioxide, aluminium oxide, sapphire, germanium, alloys of silicon or alloys of germanium. In one embodiment, the flexible substrate (10) may be made up of polymers. In one specific embodiment, the flexible substrate (10) may be made up of expanded polyethylene (EPE) sheet.

In one embodiment, the conducting path (30) may be made up of a conducting material such as a copper, aluminium, silicon or graphite. In such embodiment, the conducting material may be a metal. In one specific embodiment, the flexible substrate (10) may be made up of the conducting material which may be etched out to provide the conducting path (30). In another specific embodiment, the conducting path (30) may be fabricated on top of the first flexible layer (20). In such embodiment, the conducting path (30) may be fabricated or attached to the first flexible layer (20) using an adhesive material.

In another embodiment, the conducting path (30) may be provided with the electric power from a battery or a power supply. In such embodiment, the conducting path (30) may withstand the electric power unit the power supply or the battery may be turned off.

The flexible substrate (10) also includes a second flexible layer (40) fabricated with one or more sensors (50) connected in a form of a matrix. The second flexible layer (40) is configured to generate a signal upon receiving an interaction from at least one user. In one embodiment, the one or more sensors (50) may be one or more contact sensors, one or more pressure sensors or one or more weight sensors. As used herein, a matrix is a square or a rectangular array of numbers in mathematics. Further, matrix sensors is a type of a device in which the one or more sensors are connected in the form of the matrix, wherein the sensor matrix simultaneously measures a parameter for which the one or more sensors are configured at each point of contact between two touching surfaces. Further, contact sensors are a type of sensors which responds to a contact of an object or a user on a sensor contact face. Further, contact sensors detect the object or the user and measure dimensions based on a detected position.

Further, the pressure sensors are a type of electronic sensors which are used to measure the pressure applied on an object. Also, weight sensors also known as load sensors are a type of transduces that is used to create an electrical signal, wherein a magnitude of the electrical signal is directly proportional to an applied force.

In one embodiment, the second flexible layer (40) may be fabricated with one or more sensors (50) in the form of a matrix through the conducting path (not shown in the FIG. 1) which may be fabricated using the conducting material. In such embodiment, the one or more sensors (50) and the conducting path for a connection between the one or more sensors (50) may be attached to the second flexible layer (40) using an adhesive material. In one embodiment, the second flexible layer (40) may generate a signal when the user interacts with the second flexible layer (40).

The flexible substrate (10) further includes a third flexible layer (60) fabricated in-between the first flexible layer (20) and the second flexible layer (40). The third flexible layer (60) is configured to insulate the conducting path (30) of the first flexible layer (20) from a matrix connection of the second flexible layer (40). In one embodiment, the third flexible layer (60) may be an insulating layer. In such embodiment, the third flexible layer (60) may be placed in-between the first flexible layer (20) and the second flexible layer (40) to avoid short circuit between the one or more sensors (50).

In one embodiment, the third flexible layer (60) may include one or more slots (not shown in the FIG. 1) which may be etched out from the third flexible layer (60).

Further, the one or more slots may be configured to locate the one or more sensors (50) on the second flexible layer (40) and to provide connectivity to the one or more sensors (50) with the conducting path (30).

In one embodiment, when the user interacts with the flexible substrate (10), the one or more sensors (50) may get in contact with the conducting path (30) of the first flexible layer (20) through the one or more slots of the third flexible layer (60). Further, the conducting path (30) of the first flexible layer (20) which may be supplied by the electric power may in turn supply the electric power to the one or more sensors (50) on the second flexible layer (40) via the conducting path of the second flexible layer (60). Further, the third flexible layer (60) may insulate the other parts of the second flexible layer (40) from getting into contact with the first flexible layer (20).

The flexible substrate (10) further includes at least one support structure (70) operatively coupled to the first flexible layer (20), the second flexible layer (40) and the third flexible layer (60). The at least one support structure (70) is configured to receive the signal generated by the second flexible layer (40). The at least one support structure (70) is also configured to provide a support for the first flexible layer (20), the second flexible layer (40) and the third flexible layer (60). In one embodiment, the at least one supporting structures (70) may include a processing device which may be configured to process the signal generated by the plurality of sensors (50). The at least one supporting structure (70) may also include an analog input extension device configured to receive an analog input. In such embodiment, the signal generated by the plurality of sensors (50) may be an analog signal. In one embodiment, the at least one support structure (70) may be made up of wood or aluminium bars.

The at least one supporting structures (70) may further include a wireless communication module which may be configured to transmit the signal processed by the processing device to another device. In such embodiment, the wireless communication module may be a Bluetooth module, a wireless fidelity (Wi-Fi) module, or a Bluetooth low energy module. In one embodiment, the device may be a hand held device such as a mobile phone, a laptop or a tablet. In another embodiment, the device may be any computer device.

Figure 2:
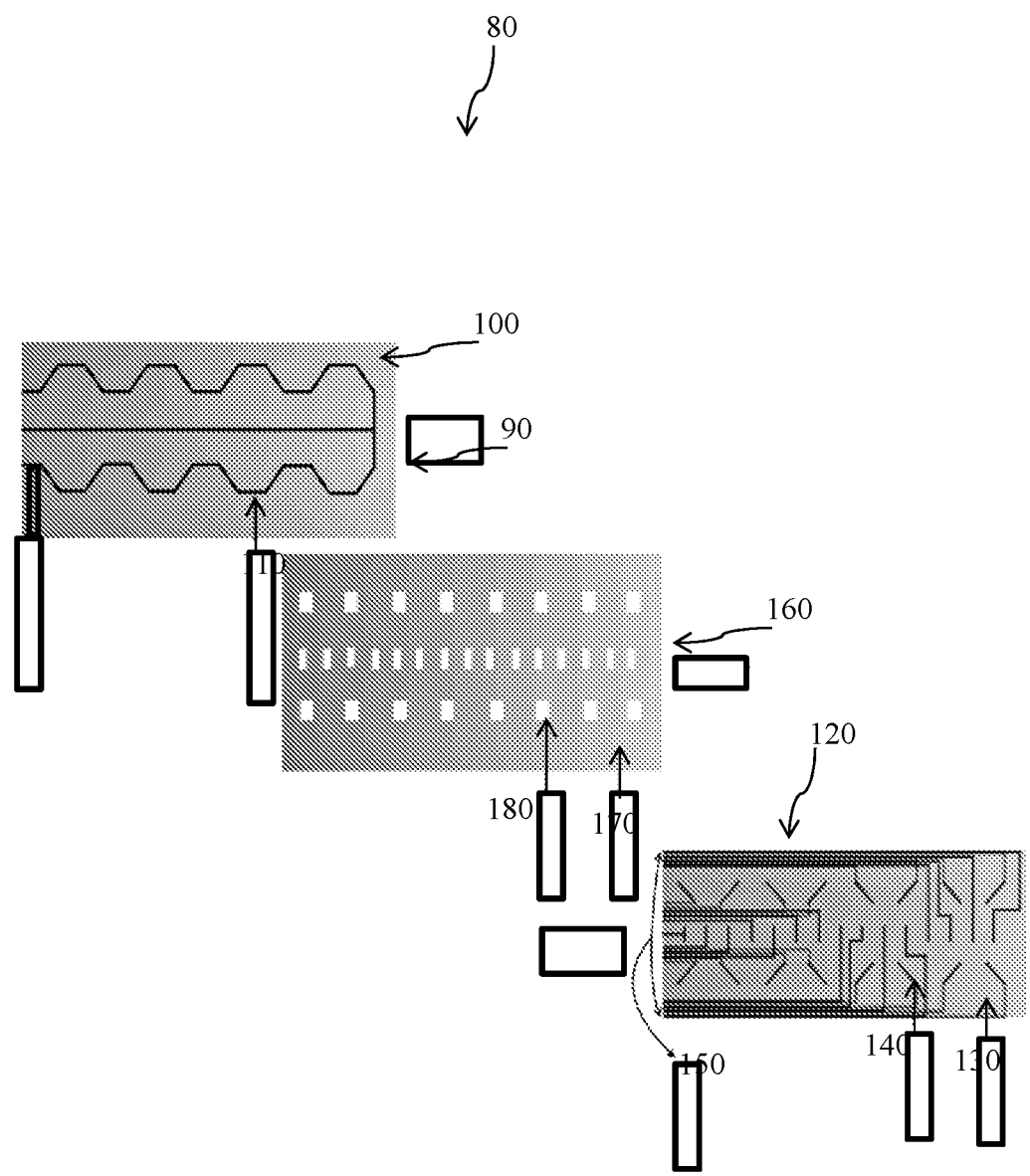
FIG. 2 is an exemplary embodiment representing a schematic view of a flexible substrate of FIG. 1 in accordance with an embodiment of the present disclosure.

FIG. 2 is an exemplary embodiment representing a schematic view of a flexible substrate of FIG. 1 in accordance with an embodiment of the present disclosure. The flexible substrate (80) includes a first layer (90), a second layer (120) and a third layer (160) which is substantially similar to a first flexible layer (20), a second flexible layer (40) and a third flexible layer (60) of FIG. 1.

The first layer (90) is attached with a connecting path (110), wherein the connecting path (110) is substantially similar to a conducting path (30) of FIG. 1. The third layer (160) includes a plurality of slots (180). Further, the second layer (120) includes a plurality of sensors (not shown in FIG. 2) connect to each other through the connecting path (140), wherein the plurality of sensors is similar to one or more sensors (50) of FIG. 1.

Further, the second layer (120) includes two supporting structures (150), each fixed to each end of the second layer (120), wherein the two supporting structures (150) are similar to at least one support structure (70) of FIG. 1.

Further, the material used for the first layer (90), the second layer (120) and the third layer (160) may be an expanded polyethylene (EPE) sheets (100, 170, 130). In one embodiment, the EPE sheets may be of nano thickness with the order of ten power minus nine. Further, one side of the first layer (90) may be attached with the connecting path (110) which may be made up of a conducting material such as a metal. In such embodiment, the metal may be a copper, aluminium, grapheme, silicon, zinc, nickel, iron, gold, silver or platinum.

Further, the connecting path (110) may be designed in such a way that the connecting path (110) easily comes in contact with the plurality of sensors in the second layer (120). Further, the connecting layer (110) may be supplied with a continuous power supply which may make the first layer (90) to withstand the continuous power supply. In one embodiment, the continuous power supply may be supplied from a battery or regulated power supply.

Further, the third layer (160) may be an insulating layer which may include the plurality of slots (180). More specifically, the third layer (160) may be free from any type of conducting material to avoid the flow of electric power in the third layer (160).

Further, the second layer (120) may be fabricated with the plurality of sensors in the form of a matrix. In one specific embodiment, the plurality of sensors may be a plurality of connecting sensors. In another embodiment, the plurality of sensors may be a plurality of pressure sensors or a plurality of weight sensors. Further, each side of the second layer (120) may be attached with two supporting structures (150), wherein each of the two supporting structures (150) may be placed at each end of the second layer (120). In one embodiment, the second layer (120) may be fabricated with at least one supporting structure on each side of the second layer (120).

Further, the first layer (90), the second layer (120) and the third layer (160) may be placed one on top of the other by keeping the third layer (160) in-between the first layer (90) and the second layer (120). Further, a user may come in contact with the flexible substrate (80) and may induce a pressure on one part of the flexible substrate (80). Further, depending on the pressure, the plurality of sensors which may be fabricated at the one part of the flexible substrate (80) where the pressure may be applied may come in contact with connecting path (110) of the first layer (90) through the plurality of slots (180) on the third layer (120).

Further, the plurality of sensors at the one part of the flexible substrate (80) where the pressure may be applied may generate a signal which may depend on the pressure applied by the user. Further, the signal generated may be passed on to the two supporting structures (150) on the second layer (120).

Further, in one embodiment, the two supporting structures (150) may include a processing device which may be configured to process the signal generated by the plurality of signals. The two supporting structures (150) may also include an analog input extension device configured to receive an analog input. In such embodiment, the signal generated by the plurality of sensors may be an analog signal.

The two supporting structures (150) may further include a wireless communication module which may be configured to transmit the signal processed by the processing device to another device. In such embodiment, the wireless communication module may be a Bluetooth module, a wireless fidelity (Wi-Fi) module, or a Bluetooth low energy module. In one embodiment, the device may be a hand held device such as a mobile phone, a laptop or a tablet. In another embodiment, the device may be any computer device.

Figure 3:
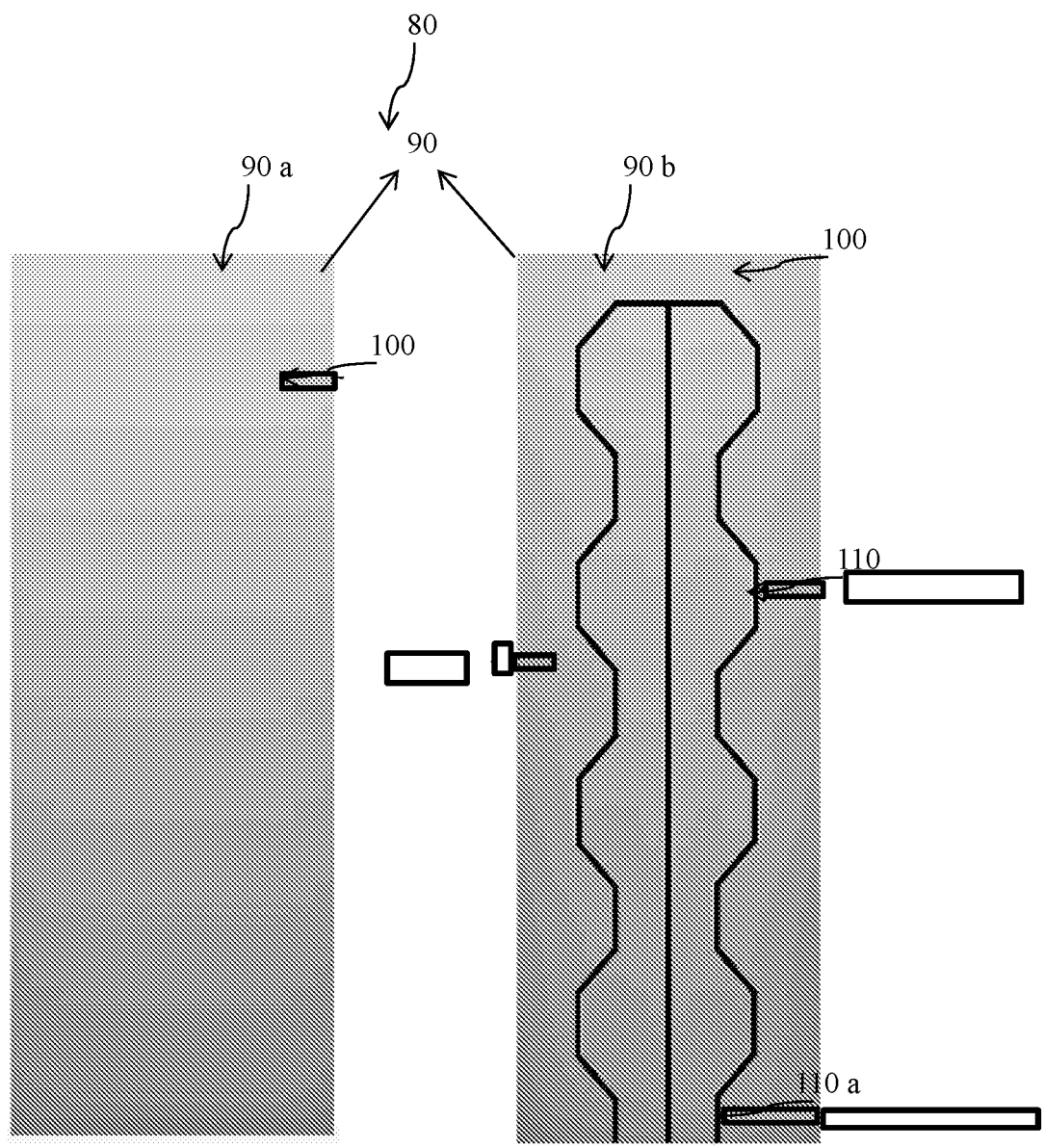
FIG. 3 is another exemplary embodiment representing a schematic view of a first layer of a flexible substrate of FIG. 2 in accordance with an embodiment of the present disclosure.

FIG. 3 is another exemplary embodiment representing a schematic view of a first layer of a flexible substrate of FIG.

2 in accordance with an embodiment of the present disclosure. The first layer (90) is substantially similar to a first layer (90) of FIG. 1. The first layer (90) may be attached with a connecting path (110), wherein the connecting path (110) is substantially similar to the connecting path (110) of the first layer (90) of FIG. 2. In one embodiment, the first layer (90) may be fabricated with an expanded polyethylene (EPE) sheet (100). Further, the first layer (90) of the flexible substrate (80) represents a front side (90a) view and a back side (90b) view.

Further, the connecting path (110) may be fabricated on the back side (90b) of the first layer (90).

In one embodiment, the connecting path (110) may be connected to a power supply which may make the connecting path (110) to withstand electric power which may be supplied by the power supply. In such embodiment, the power supply may be a rechargeable battery. Further, with reference to the above mentioned embodiment, a positive end of the power supply may be applied to a bottom right corner (110a) of the connecting path (110) to keep a track of a flow of the electric power or may be for a convenience purpose. Further, the front side (90a) of the first layer (90) may be kept plane or free from any type of components or connections.

Figure 4:
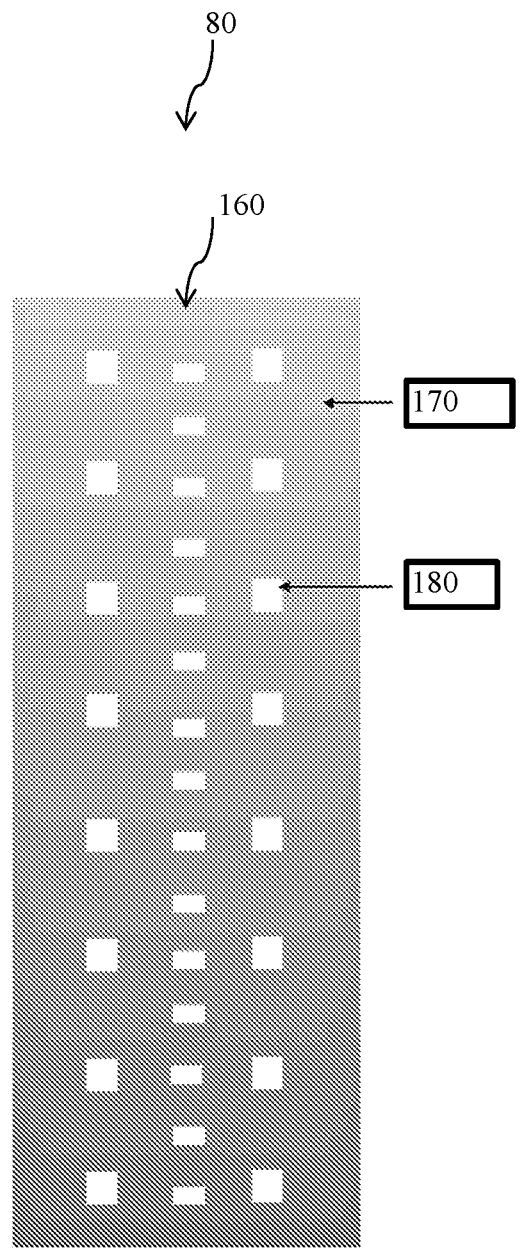
FIG. 4 is yet another exemplary embodiment representing a schematic front view of a second layer of a flexible substrate of FIG. 2 in accordance with an embodiment of the present disclosure.

FIG. 4 is yet another exemplary embodiment representing a schematic front view of a second layer of a flexible substrate of FIG. 2 in accordance with an embodiment of the present disclosure. The second layer (120) is substantially similar to a second layer (120) of FIG. 2. The FIG. 3 represents a front view of the second layer (120) of the flexible substrate (80). Further, the second layer (120) may be fabricated using an expanded polyethylene (EPE) sheet (130).

The second layer (120) may be fabricated with a plurality of sensors, wherein the plurality of sensors is substantially similar to a plurality of sensors of FIG. 2. In one embodiment, the plurality of sensors may be a plurality of connecting sensors, a plurality of pressure sensors or a plurality of weight sensors. In such embodiment, the plurality of sensors may be connected in a form of a matrix. Further, each of the plurality of sensors may be pulled down to ground or made zero volts by interfacing a plurality of resistors to the corresponding plurality of sensors.

Further, the second layer (120) of the flexible substrate (80) includes a supporting structure (150) corresponding to each side of the second layer (120), wherein the supporting structure (150) is substantially similar to a two supporting structures (150) of FIG. 2. Further, the plurality of sensors may generate a signal when at least one user applies a pressure on at least one part of the second layer. Further, the plurality of sensors may be connected to each other through a connecting path (140). In one embodiment, the connecting path (140) may be fabricated using a conducting material.

Further, the supporting structure (150) may include a processing device which may be configured to process the signal which may be generated by the plurality of sensors. The supporting structure (150) may also include an analog input device which may be configured to receive the signal generated by the plurality of sensors and transmit the receive signal to the processing device to process the signal. In such embodiment, the analog input device may be operatively coupled to the plurality of sensors and the processing device. Further, the analog input device may be used to receive the signal as the signal generated by the plurality of sensors may be an analog signal.

Further, the processed signal may be transmitted to another device with the help of a transmitting module. In such embodiment, the transmitting module may be a wired transmitting module or a wireless transmitting module. In one embodiment, the wireless transmitting module may be a Bluetooth transmitting module, a Bluetooth low energy (BLE) module or a wireless fidelity (Wi-Fi) module. In another embodiment, the device may be a hand held device such as a mobile phone, a laptop or a tablet. In such embodiment, the transmitting module may transmit the signal generated by the plurality of sensors to the device in real time.

Figure 5:
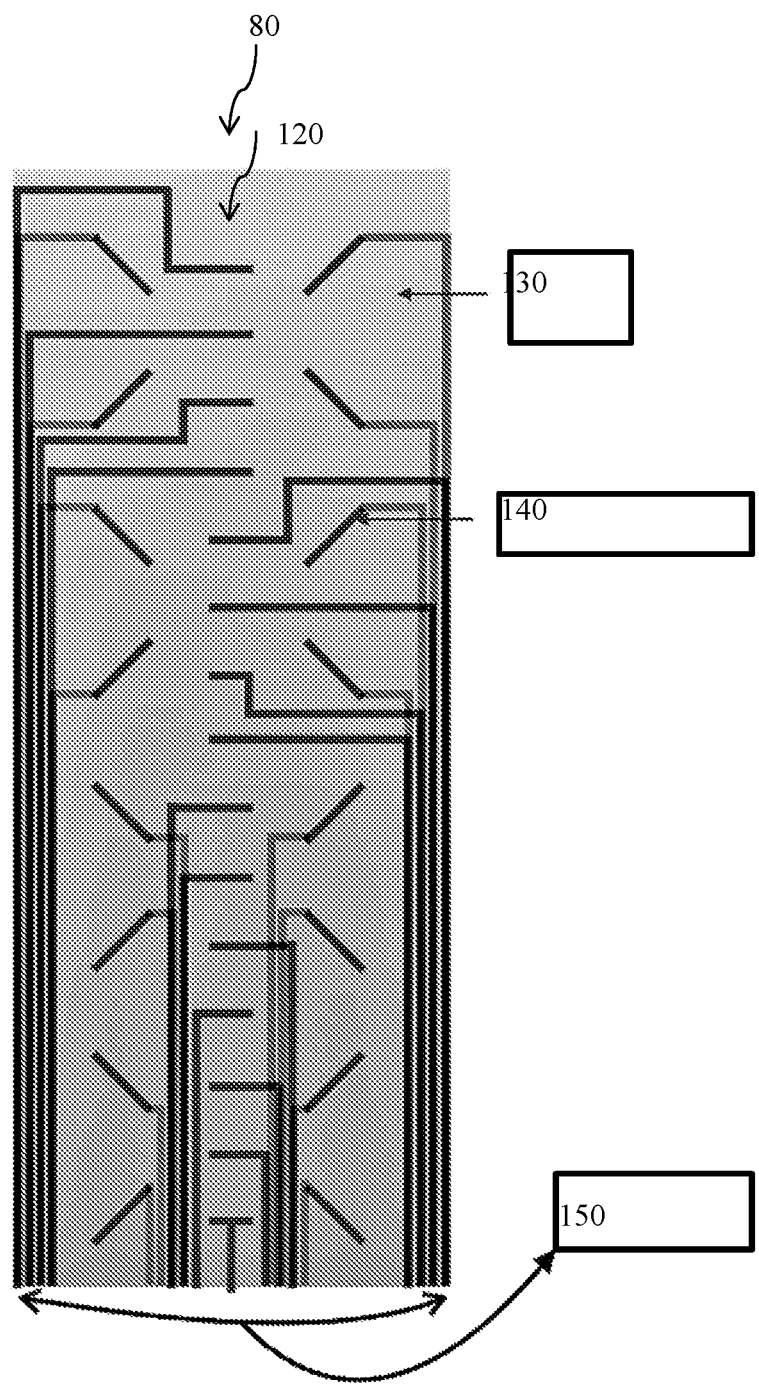
FIG. 5 is yet another exemplary embodiment representing a schematic back view of a second layer of a flexible substrate of FIG. 2 in accordance with an embodiment of the present disclosure.

FIG. 5 is yet another exemplary embodiment representing a schematic back view of a second layer of a flexible substrate of FIG. 2 in accordance with an embodiment of the present disclosure. The second layer (120) of the flexible substrate (80) is substantially similar to a second layer (120) of FIG. 2. The FIG. 5 represents a back side view of the second layer. Further, the back side of the second layer may include a connecting path (140) which may be configured to connect a plurality of sensors, wherein the connecting path (140) is substantially similar to a connecting path (120) of FIG. 2 and the plurality of sensors is substantially similar to a plurality of sensors of FIG. 2. Further, the substrate (130) used to fabricate the second layer (120) may be an expanded polyethylene (EPE) sheets.

Figure 6:
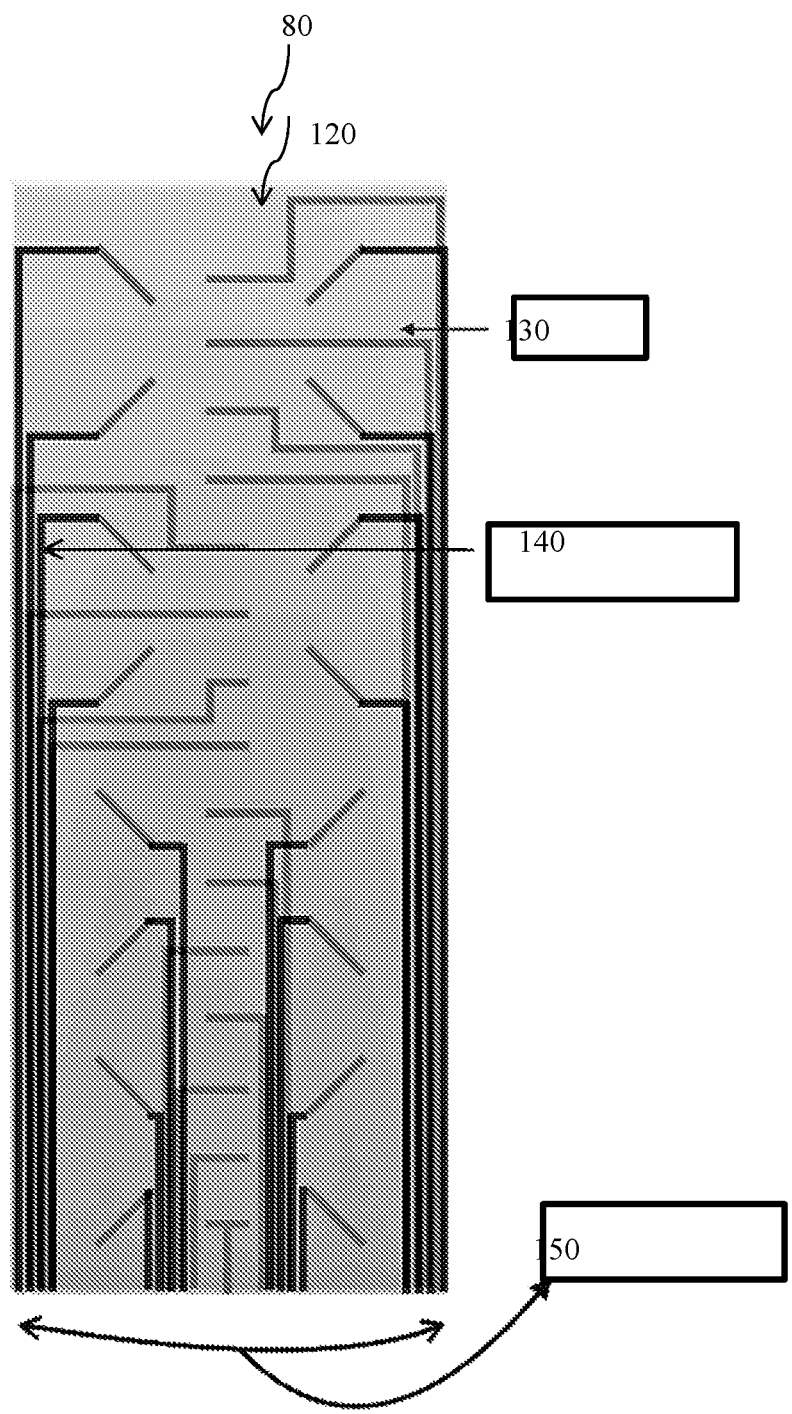
FIG. 6 is yet another exemplary embodiment representing a schematic view of a third layer of a flexible substrate of FIG. 2 in accordance with an embodiment of the present disclosure.

FIG. 6 is yet another exemplary embodiment representing a schematic view of a third layer of a flexible substrate of FIG. 2 in accordance with an embodiment of the present disclosure. The third layer (160) of the flexible substrate (80) is substantially similar to a third layer (160) of FIG. 2. Further, the third layer (160) may be an insulating layer. Further, the third layer (160) may include a plurality of slots (180). In one embodiment, the third layer (160) may be fabricated using an expanded polyethylene (EPE) sheet (170). Further, the third layer (160) of the flexible substrate (80) may be positioned between a first layer (90) and a second layer (120) of the flexible substrate (80) to avoid an electric power leakage between the first layer (90) and the second layer (120).

Further, the plurality of slots (180) may be configured to assist a plurality of sensors of the third layer (160) to come in contact with the first layer (90) to receive the electric power for the working of the plurality of sensors. In such embodiment, the electric power may be received from a connecting path (110) of the first layer (90) which may be supplied by a power supply source.

In one specific embodiment, at least one user may make a physical contact with the flexible substrate (80). Further, a part of the flexible substrate (80) on which the at least one user may make a contact, may start to generate a signal based on the amount of pressure applied on the part of the flexible substrate (80) or based on the kind of contact made by the user on the part of the flexible substrate (80). In such embodiment, as the at least one user makes a contact, the plurality of sensors which may be fabricated on the second layer (120) of the flexible substrate (80) may come in contact with the connecting path (110) of the first layer (90) of the flexible substrate (80) through the plurality of slots (180) on the third layer (160) of the flexible substrate (80).

Further, as the plurality of sensors come in contact with the connecting path (110) of the first layer (90), the circuit in the second layer (120) gets complete giving rise to an electrical path in the second layer (120). In such embodiment, the electric power to the connecting path (110) of the first layer may be supplied by a power supply which may be operatively coupled to a supporting structure (150) of the second layer (120) of the flexible substrate (80). Further, with reference to the above mentioned embodiment, the plurality of sensors may generate an analog signal. In such embodiment, the range of the analog signal may depend on the amount of pressure which may be applied by the at least one user or may depend on the type of contact made by the at least one user with the flexible substrate (80).

Further, the analog signal generated may be transmitted to an analog input device which may be operatively coupled to the supporting structure of the third layer (160). Further, the analog input device may transmit the analog signal receive to the processing device which may be operatively coupled to the analog input device to process the analog signal.

Further, the signal processed may be transmitted to another device either through a wired or wireless means. In one embodiment, the signal processed may be stored in a storage device which may be operatively coupled to the processing device of the flexible substrate (80).

In one embodiment, based on the signal received on the device, the amount of pressure applied by the at least one user on the flexible substrate (80) may be determined. In another embodiment, based on the signal received on the device, the type of contact made by the at least one user may be determined. In such embodiment, the pressure applied or the type of contact made by the at least one user may be determined by comparing the received signal with a pre-defined dataset, wherein the pre-defined data set may be pre-installed in the device which may receive the signal or may be pre-installed in the processing device.

In one embodiment, the device may be a hand held device such as a laptop, a tablet or a mobile phone. In another embodiment, the device may be any computer device.

In one exemplary embodiment, the pre-defined data set may be pre-installed on a remote server such as a cloud server. Further, the signal generated by the plurality of sensors which may be processed by the processing device may also be transmitted to the remote server. In such embodiment, the at least one user may determine the amount of pressure applied on the flexible substrate or the type of contact made with the flexible substrate through the cloud server.

Figure 7:
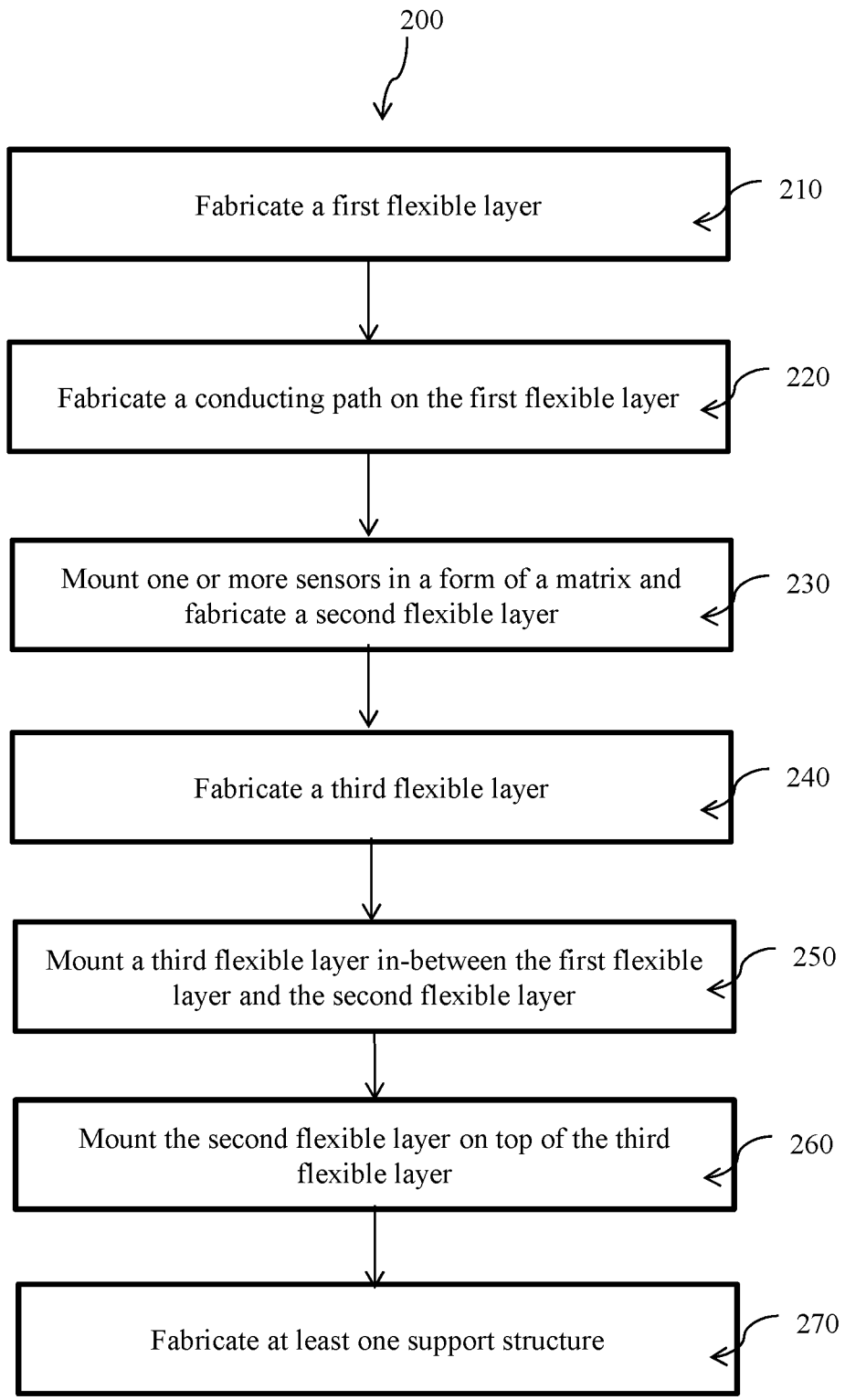
FIG. 7 is a process flow for a flexible substrate in accordance with an embodiment of the present disclosure.

FIG. 7 is a process flow for a flexible substrate in accordance with an embodiment of the present disclosure. The method (200) includes fabricating a first flexible layer (200). In one embodiment, the first flexible layer may be fabricated using an expanded polyethylene (EPE) sheet. In such embodiment, the EPE sheet may be fabricated into a thin layer.

The method (200) also includes fabricating a conducting path on the first flexible layer (210). In one embodiment, the conducting path may be attached to the first flexible layer. In such embodiment, the conducting path may be attached using an adhesive material. In another embodiment, the first layer may be fabricated using a conducting material and the conducting path may be etched out from the conducting material. In such embodiment, the conducting path may be fabricated using a conducting material such as conducting metal. In one embodiment, the conducting metals may be a copper, aluminium, grapheme, silicon, zinc, nickel, iron, gold, silver or platinum. In yet another embodiment, the conducting path may be fabricated on a back side of the first flexible layer.

The method (200) further includes mounting one or more sensors in a form of a matrix and fabricating a second flexible layer (230). In one embodiment, the second layer may be implanted with the one or more sensors to fabricate the second flexible layer. In one embodiment, the second flexible layer may be fabricated using the EPE sheet. In another embodiment, the one or more sensors may be one or more contact sensors, one or more pressure sensors or one or more weight sensors. In yet another embodiment, the one or more sensors may be connected to each other in a form of the matrix through the conducting path.

The method (200) further includes fabricating a third flexible layer (240). In one embodiment, the third flexible layer may be fabricated using the EPE sheet. In another embodiment, the third flexible layer may be an insulating layer. In yet another embodiment, the third flexible layer may include a plurality of slots. In such embodiment, the plurality of slots may be etched out during fabrication of the third flexible layer. Further, the plurality of slots may be configured to induce a contact between the conducting layer of the first flexible layer and the plurality of sensors of the second flexible layer.

The method (200) further includes mounting a third flexible layer in-between the first flexible layer and the second flexible layer (250). In one embodiment, the third flexible layer may act as an insulating layer which may avoid the excess flow of electric power in the flexible substrate and may also avoid the short circuiting of the one or more sensors with the conducting path.

The method (200) further includes mounting the second flexible layer on top of the third flexible layer (260). In one embodiment, the third flexible layer may be mounted on top of the back side of the first flexible layer. Further, the second flexible layer may be mounted on another side of the third flexible layer. In such embodiment, a front side of the second flexible layer may be mounted on the other side of the third flexible layer.

The method (200) further includes fabricating at least one support structure (270). In one embodiment, the at least one support structure may be fabricated on each side of the second flexible layer. In such embodiment, the at least one support structure may provide a support and a strength to the first flexible layer, the second flexible layer and the third flexible layer.

In one specific embodiment, the method (200) for the flexible structure may include receiving an interaction from at least one user. In one embodiment, the interaction of the at least one user may be applying a pressure on the flexible substrate or making a contact with the flexible substrate.

The method (200) may also include generating a signal upon receiving the interaction from the user. In one embodiment, the signal may be generated by the at least one sensors upon receiving an interaction from the at least one user. In such embodiment, upon receiving the interaction from the at least one user, the at least one sensor may come in contact with the conducting path of the first flexible layer which may complete the circuit in the second flexible layer and may provoke the at least one sensor to generate the signal. In one embodiment, the signal strength may depend on the amount of pressure applied by the at least one user on the flexible substrate or the type of contact made by the at least one user with the flexible substrate.

The method (200) may further include transmitting the signal generated to the at least one support structure. In one embodiment, the at least one support structure may include an analog input device which may be configured to receive the signal transmitted by the at least one sensor. In another specific embodiment, the method may further include processing the signal received. In one embodiment, the signal received by the analog input device may be transmitted to a processing device for further processing of the signal.

Further, with reference to the above mentioned embodiment, the method (200) may further include transmitting the signal processed to at least one device. In one embodiment, the signal which may be processed by the processing device may be transmitted to the at least one device. In such embodiment the at least one device may be a hand held device such as a laptop, a tablet or a mobile phone or any computer device.

In one embodiment, the signal generated by the at least one sensor may be compared with a pre-defined data set for analysing the amount of pressure applied by the at least one user or for analysing the type of contact made by the at least one user with the flexible substrate. In another embodiment, the at least one user may analyse a plurality of information by comparing the signal received on the device with the pre-defined data set.

Various embodiment of the flexible substrate enable the flexible substrate to avoid short circuiting between the components, which enhances the efficiency of the flexible substrate. Using the insulating layer in between the first flexible layer and the second flexible layer reduces leakage current between the different layers of the flexible substrate.

Various embodiment of the flexible substrate also enable the flexible substrate from heat and sound insulation. Further, because of the usage of the expanded polyethylene sheet moisture proofing happens to the flexible substrate and also provides anti-friction.

Further, the flexible substrate is light in weight making the flexible substrate user friendly. Further the EPE sheets are chemically inert, non-toxic and fungal resistant hence making the flexible substrate eco-friendly. Also, the EPE sheets have low thermal conductivity, anti-aging and extended durability. Further, the EPE sheets have high heat resistance.

Various embodiment of the flexible substrate further enable the flexible substrate of being flexible which also adds rigidity to a lightweight fabric and hence making the flexible substrate low maintenance. Further, the method enables to house the plurality of sensors with minimum interface. Hence increasing the accuracy of the flexible substrate. Also the flexible substrate consumes low power and is highly resistant to abrasion and is highly conductive.

The figures and the foregoing description give examples of embodiments. Those skilled in the art will appreciate that one or more of the described elements may well be combined into a single functional element. Alternatively, certain elements may be split into multiple functional elements. Elements from one embodiment may be added to another embodiment. For example, order of processes described herein may be changed and are not limited to the manner described herein. Moreover, the actions of any flow diagram need not be implemented in the order shown; nor do all of the acts need to be necessarily performed. Also, those acts that are not dependent on other acts may be performed in parallel with the other acts. The scope of embodiments is by no means limited by these specific examples.

We claim:

1. A flexible substrate (10) comprising:
a first flexible layer (20) fabricated with at least one conducting path (30), and configured to sustain an electric power within the conducting path (30);
a second flexible layer (40) fabricated with one or more sensors (50), wherein the second flexible layer (40) is configured to generate a signal upon receiving an interaction from at least one user;
a third flexible layer (60) fabricated in-between the first flexible layer (20) and the second flexible layer (40), and configured to insulate the conducting path (30) of the first flexible layer (20) from the one or more sensors of the second flexible layer (40);
at least one support structure (70) operatively coupled to the first flexible layer (20), the second flexible layer (40) and the third flexible layer (60), wherein the at least one support structure (70) is configured to:
receive the signal generated by the second flexible layer; and
provide a support for the first flexible layer, the second flexible layer and the third flexible layer,
wherein the third flexible layer (60) comprises one or more slots configured to locate the one or more sensors (50) on the second flexible layer (40) and to provide a connectivity to the one or more sensors (50) with the conducting path (30) of the first flexible layer (20).

2. The flexible substrate (10) as claimed in claim 1, wherein the flexible substrate comprises an expanded polyethylene (EPE) sheet.

3. The flexible substrate (10) as claimed in claim 1, wherein at least one conducting path (30) comprises the at least one conducting path (30) fabricated using a conducting material.

4. The flexible substrate (10) as claimed in claim 1, wherein the conducting path (30) is fabricated within the first flexible layer (20) using an adhesive material.

5. The flexible substrate (10) as claimed in claim 1, wherein the one or more sensors comprises (50) one or more contact sensors, one or more pressure sensors or one or more weight sensors,
wherein the one or more sensors are arranged in the form of a matrix.

6. The flexible substrate (10) as claimed in claim 1, wherein the third flexible layer (60) comprises an insulating layer.

7. The flexible substrate (10) as claimed in claim 1, wherein the at least one support structure (70) comprises:
a battery configured to provide electric power to the conducting path (30) of the first flexible layer (20);
a processor operatively coupled to the battery, and configured to process the signal generated;
a wireless transmission module operatively coupled to the processor, and configured to transmit the signal processed to a computer device.

8. A flexible substrate (10) comprising:
a first flexible layer (20) fabricated with at least one conducting path (30), and configured to sustain an electric power within the conducting path (30);
a second flexible layer (40) fabricated with a plurality of sensors (50);
a third flexible layer (60) fabricated in-between the first flexible layer (20) and the second flexible layer (40), and configured to insulate the conducting path (30) of the first flexible layer (20) from some portions of the second flexible layer (40) while being configured to connect the conducting path (30) to one of more of the plurality of sensors upon interaction from a user;
at least one support structure (70) operatively coupled to the first flexible layer (20), the second flexible layer (40) and the third flexible layer (60), wherein the at least one support structure (70) is configured to:
receive the signal generated by the second flexible layer; and
provide a support for the first flexible layer, the second flexible layer and the third flexible layer.

9. The flexible substrate of claim 8, wherein the third flexible layer comprises one or more slots configured to locate the plurality of sensors on the second flexible layer and to provide a connectivity to the one or more of the plurality of sensors with the conducting path upon the interaction from the user.

10. The flexible substrate system of claim 9, wherein the flexible substrate comprises an expanded polyethylene (EPE) sheet.

11. The flexible substrate of claim 10, wherein the conducting path is fabricated within the first flexible layer using an adhesive material.

12. The flexible substrate of claim 11, wherein the plurality of sensors comprise contact sensors, pressure sensors or weight sensors,
wherein the plurality of sensors are arranged in the form of a matrix.

13. The flexible substrate of claim 12, wherein the at least one support structure comprises:
a battery configured to provide electric power to the conducting path of the first flexible layer;
a processor operatively coupled to the battery, and configured to process the signals generated by the one or more of the plurality of sensors upon interaction from the user; and
a wireless transmission module operatively coupled to the processor, and configured to transmit the signals processed to a computer device.

14. A method (200) for fabrication of a flexible substrate, the method comprising:
fabricating a first flexible layer (210);
fabricating a conducting path on the first flexible layer (220), the conducting path to sustain an electric power within the conducting path;
mounting one or more sensors and fabricating a second flexible layer (230);
fabricating a third flexible layer (240) comprising one or more slots configured to locate the one or more sensors on the second flexible layer and to provide a connectivity to the one or more sensors with the conducting path (30) of the first flexible layer (20);
mounting the third flexible layer such that it is disposed between the first flexible layer and the second flexible layer (250);
mounting the second flexible layer on top of the third flexible layer (260); and
fabricating at least one support structure (270).

15. The method (200) as claimed in claim 14, wherein the method further comprises:
receiving an interaction from at least one user;
generating a signal upon receiving the interaction from the user; and
transmitting the signal generated to the at least one support structure.

16. The method of claim 15, wherein the interaction from the at least one user is received in the form of application of a pressure on the flexible substrate or making of a contact by the at least one user with the flexible substrate.

17. The method of claim 16, wherein the at least one support structure further comprises an analog input device to first receive the signals generated by the one or more of the plurality of sensors, the analog input device then transmitting the signals to the processing device for further processing of the signals.

18. The method of claim 14, wherein the conducting path is attached to the first flexible layer using an adhesive material, and
wherein the one or more sensors are arranged in the form of a matrix.

19. The method of claim 14, wherein the least one support structure is fabricated on each side of the second flexible layer.

* * * * *